US010297913B2

(12) United States Patent
Khoury

(10) Patent No.: US 10,297,913 B2
(45) Date of Patent: May 21, 2019

(54) SHIELDED RADIO FREQUENCY COMPONENT WITH INTEGRATED ANTENNA

(71) Applicant: Skyworks Solutions, Inc., Woburn, MA (US)

(72) Inventor: George Khoury, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 37 days.

(21) Appl. No.: 15/585,631

(22) Filed: May 3, 2017

(65) Prior Publication Data
US 2017/0324160 A1 Nov. 9, 2017

Related U.S. Application Data

(60) Provisional application No. 62/331,711, filed on May 4, 2016.

(51) Int. Cl.
*H01Q 1/22* (2006.01)
*H01Q 1/52* (2006.01)
(52) U.S. Cl.
CPC ........... *H01Q 1/526* (2013.01); *H01Q 1/2283* (2013.01); *H01Q 1/2291* (2013.01)
(58) Field of Classification Search
CPC ........ H01Q 1/2291; H01Q 1/526; H01Q 1/52; H01Q 1/2283; H01Q 1/22; H01Q 1/38; H01Q 1/48
See application file for complete search history.

(56) References Cited

U.S. PATENT DOCUMENTS 6,388,623 B1 * 5/2002 Sakota ................. H01Q 1/3233
257/672
6,392,603 B1 5/2002 Kurz et al.
6,472,598 B1 * 10/2002 Glenn ..................... H01L 23/24
174/535

(Continued)

FOREIGN PATENT DOCUMENTS

WO WO 2016189199 12/2016

OTHER PUBLICATIONS

Amkor, System in Package (SIP) Technology Solutions Data Sheet, Rev. Nov. 2015, 4 pages, available at: https://www.amkor.com/index.cfm?objectid=0638A98A-A85E-0A85-F5EF006A6CEEEC13 (accessed on May 24, 2017).

(Continued)

*Primary Examiner* — Tho G Phan
(74) *Attorney, Agent, or Firm* — Knobbe Martens Olson & Bear LLP

(57) ABSTRACT

Aspects of this disclosure relate to a shielded radio frequency component with an integrated antenna. An antenna can be on a first side of a multi-layer substrate and a radio frequency component can be disposed on a second side of the multi-layer substrate such that a ground plane of the multi-layer substrate is positioned between the antenna and the radio frequency component. Conductive features can be disposed around the radio frequency component and electrically connected to the ground plane. The conductive features and the ground plane can provide shielding for the radio frequency component. In certain embodiments, the conductive features can include bumps, such as solder bumps and/or copper pillars.

20 Claims, 8 Drawing Sheets

(56) References Cited

U.S. PATENT DOCUMENTS

| | | | |
|---|---|---|---|
| 6,686,649 B1 | 2/2004 | Mathews et al. | |
| 6,734,539 B2 * | 5/2004 | Degani | H01L 23/552 257/659 |
| 6,850,196 B2 | 2/2005 | Wong et al. | |
| 6,861,731 B2 | 3/2005 | Buijsman et al. | |
| 7,110,741 B2 * | 9/2006 | Knopik | H01Q 9/04 343/700 MS |
| 7,579,672 B2 * | 8/2009 | Wu | H01L 21/56 257/659 |
| 8,410,990 B2 | 4/2013 | Kazanchian | |
| 2004/0252064 A1 | 12/2004 | Yuanzhu | |
| 2008/0158063 A1 * | 7/2008 | Zeng | H01Q 1/2283 343/700 MS |
| 2010/0103058 A1 | 4/2010 | Kato et al. | |
| 2012/0313821 A1 | 12/2012 | Fischer | |
| 2013/0334321 A1 | 12/2013 | Kato et al. | |
| 2014/0175621 A1 | 6/2014 | Chen et al. | |
| 2014/0225795 A1 | 8/2014 | Yu | |
| 2014/0252595 A1 | 9/2014 | Yen et al. | |
| 2014/0253382 A1 | 9/2014 | Markish et al. | |
| 2015/0222012 A1 | 8/2015 | Van Zeijl et al. | |

OTHER PUBLICATIONS

Brown, et al, Trends in RF/Wireless Packaging An Overview, 2004, 98 pages, available at: http://www.iwpc.org/Presentations/IWPC_Trends_Packaging_Final_slides_MTT_S_2004.pdf (accessed on May 3, 2017).

Insight SiP, "Application Note AN160601 Use of ISP 1507 Development Kit," Oct. 27, 2016, available at: http://www.insightsip.com/fichiers_insightsip/pdf/ble/ISP1507/isp_ble_AN160601.pdf.

Insight SiP, "ISP 1507 High Performance Bluetooth 5 Ready, NFC & ANT Low Energy Module with MCU & Antenna," Jan. 16, 2017, available at: http://www.insightsip.com/fichiers_insightsip/pdf/ble/ISP1507/isp_ble_DS1507.pdf.

Murata Electronics, "SN8000/SN800UFL Wi-Fi Module: Data Sheet," Version 1.0, Nov. 25, 2013, available at: http://www.mouser.com/pdfdocs/sn80008000ufl_ds_112513.PDF.

Murata Electronics, "SN820X Wi-Fi Network Controller Module Family: User Manual," Version 2.2, Mar. 3, 2014, available at: http://www.mouser.com/pdfdocs/sn820x_manual_030314.PDF.

Murata Electronics, "Bluetooth Low Energy Module Data Sheet," Rev. J, Feb. 27, 2015, available at: http://wireless.murata.com/eng/products/rf-modules-1/bluetooth/type-zy.html PDF.

\* cited by examiner

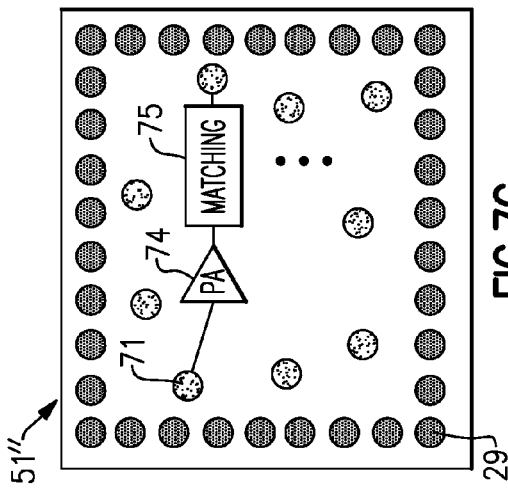
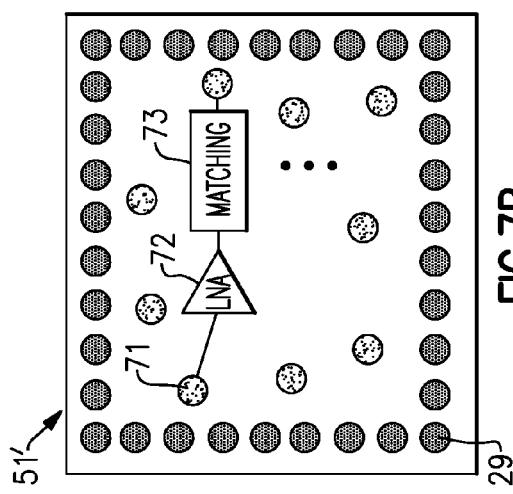
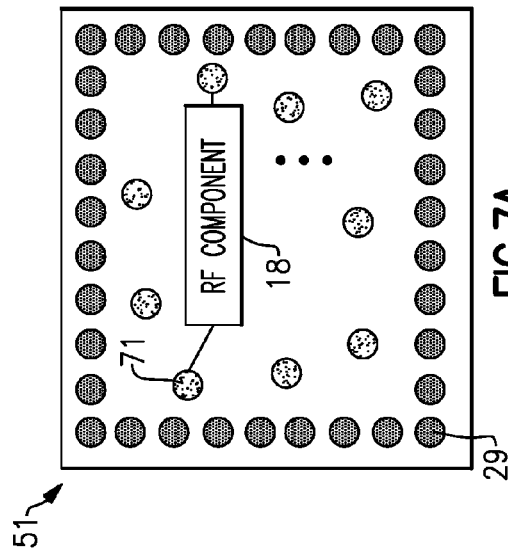
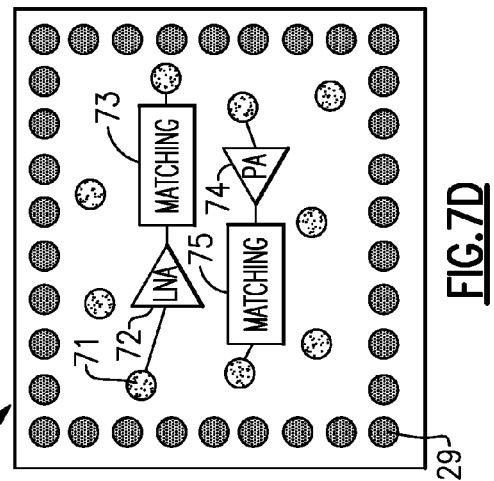
FIG. 7A
FIG. 7B
FIG. 7C
FIG. 7D

SHIELDED RADIO FREQUENCY COMPONENT WITH INTEGRATED ANTENNA

CROSS REFERENCE TO PRIORITY APPLICATION

This application claims the benefit of priority of U.S. Provisional Patent Application No. 62/331,711, filed May 4, 2016 and titled "SHIELDED PACKAGE WITH INTEGRATED ANTENNA," the disclosure of which is hereby incorporated by reference in its entirety herein.

BACKGROUND

Technical Field

This disclosure relates to shielding between an antenna and a radio frequency component.

Description of Related Technology

Packaged semiconductor modules can include integrated shielding technology within a package. A shielding structure can be formed around a radio frequency component. The shielding structure can shield the radio frequency component from electromagnetic radiation that is external to the shielding structure. The shielding structure can shield circuit elements external to the shielding structure from electromagnetic radiation emitted by the radio frequency component. As more components are being integrated together with each other in a radio frequency module, shielding components from each other in a compact and efficient manner can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a radio frequency module that includes a multi-layer substrate, an antenna, a radio frequency (RF) component, and conductive features. The multi-layer substrate has a first side and a second side opposite to the first side. The multi-layer substrate includes a ground plane. The antenna is on the first side of the multi-layer substrate. The RF component is disposed on the second side of the multi-layer substrate such that the ground plane is positioned between the antenna and the RF component. The conductive features are disposed around the RF component and electrically connected to the ground plane. The conductive features and the ground plane are configured to provide shielding for the RF component.

The conductive features can include bumps. The bumps can include one or more solder bumps. Alternatively or additionally, the bumps can include one or more copper pillars. The bumps can extend farther away from the multi-layer substrate than the RF component extends away from the multi-layer substrate. The module can include a molding material around the RF component. The module can further include a via extending through the molding material. The via can be included in an electrical connection between the ground plane and a bump of the bumps.

The antenna can be a printed antenna. The antenna can be a folded quarter wave antenna. The antenna can be a loop antenna.

The multi-layer substrate can include a dielectric layer disposed between the ground plane and the antenna. The multi-layer substrate can include a plurality of routing layers and insulating layers disposed between adjacent routing layers of the plurality of routing layers.

The multi-layer substrate can include a passive component. The passive component can be included in a matching network associated with the RF component.

The RF component can include a low-noise amplifier. Alternatively or additionally, the RF component can include a power amplifier. In certain applications, the RF component can include a radio frequency switch.

The RF component can include a plurality of die. Alternatively, the RF component can be implemented on a single die.

The antenna can be configured to transmit and/or receive RF signals associated with a Wireless Personal Area Network (WPAN) standard. The antenna can be configured to transmit and/or receive RF signals associated with a Bluetooth standard. The antenna can be configured to transmit and/or receive RF signals associated with a ZigBee standard.

Another aspect of this disclosure is a radio frequency (RF) circuit assembly that includes a laminate substrate, a printed antenna, an RF component, and bumps disposed around the RF component. The laminate substrate has a first side and a second side opposite to the first side. The laminate substrate includes a ground plane. The printed antenna is on the first side of the laminate substrate. The RF component is attached on the second side of the laminate substrate such that the ground plane is positioned between the printed antenna and the RF component. The bumps are electrically connected to the ground plane such that the bumps and the ground plane form at least a portion of a shielding structure around the RF component.

The radio frequency circuit assembly can include another bump disposed within the shielding structure and configured to provide an electrical connection to the RF component. The laminate substrate can include routing layers and insulating layers. The bumps can include at least one of copper pillars or solder bumps. The radio frequency circuit assembly can include one or more suitable features of the RF modules discussed herein.

Another aspect of this disclosure is a system board assembly that includes a laminate substrate, a printed antenna, a radio frequency (RF) component, bumps, and a system board. The laminate substrate has a first side and a second side opposite to the first side. The laminate substrate includes a ground plane. The printed antenna is on the first side of the laminate substrate. The RF component is attached on the second side of the laminate substrate such that the ground plane is positioned between the printed antenna and the RF component. The bumps are disposed around the RF component and electrically connected to the ground plane. The system board includes ground pads electrically connected to ground plane by way of the bumps such that a shielding structure is formed around the RF component.

The system board assembly can further include an electronic component on the system board. The shielding structure can be arranged so as to provide RF isolation between the RF component and the electronic component.

The bumps can provide standoff between the RF component and the system board. The bumps can include solder bumps, solder balls, and/or copper pillars.

The RF component can be embodied on a die. The RF component can be embodied on a silicon-on-insulator die.

The printed antenna and the RF component are embodied in an antenna in a package system.

The system board assembly can include one or more suitable features of any of the RF modules and/or RF circuitry assemblies discussed herein.

Another aspect of this disclosure is a front end module that includes a multi-layer substrate having a first side and a second side opposite to the first side, the multi-layer substrate including a ground plane; an antenna on the first side of the multi-layer substrate; a radio frequency (RF) component on the second side of the multi-layer substrate such that the ground plane is positioned between the antenna and the RF component, the RF component including a low noise amplifier and a switch configured to selectively electrically connect the low noise amplifier with the antenna; and conductive features disposed around the RF component and electrically connected to the ground plane, the conductive features and the ground plane configured to provide shielding for the RF component.

The front end module can further include a bypass path, and the switch can be configured to electrically connect the low noise amplifier and the integrated antenna in a first state and to electrically connect the bypass path and the integrated antenna in a second state. The front end module can further include a power amplifier, and the switch can be configured to electrically connect the power amplifier and the integrated antenna in a third state. In certain applications, the low noise amplifier and the power amplifier circuit are embodied on a single die. The die can be a semiconductor-on-insulator die.

The front end module can further include one or more suitable features of any of the RF modules and/or RF circuitry assemblies discussed herein.

Another aspect of this disclosure is a wireless communication device that includes a transceiver; and a front end system in communication with the transceiver, the front end system including a multi-layer substrate and a radio frequency (RF) component attached to a second side of the multi-layer substrate, the multi-layer substrate including an antenna printed on a first side opposite to the second side, and the multi-layer substrate including a ground plane disposed between the RF component and the ground plane.

The wireless communication device can further include a baseband processor in communication with the transceiver. The wireless communication device can further include a second antenna associated with a different front end system than the antenna. The antenna can be configured to receive a wireless personal area network signal. The wireless communication device can further include a power management circuit in communication with the front end system.

The wireless communication device can further include one or more suitable features of any of the radio frequency modules, radio frequency circuit assemblies, system board assemblies, and/or front end modules discussed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 7A is an illustrate example of radio frequency component layer of a radio frequency circuit assembly according to an embodiment.

FIG. 7B is an illustrate example of radio frequency component layer of a radio frequency circuit assembly according to another embodiment.

FIG. 7C is an illustrate example of radio frequency component layer of a radio frequency circuit assembly according to another embodiment.

FIG. 7D is an illustrate example of radio frequency component layer of a radio frequency circuit assembly according to another embodiment.

DETAILED DESCRIPTION OF CERTAIN EMBODIMENTS

Figure 1A:
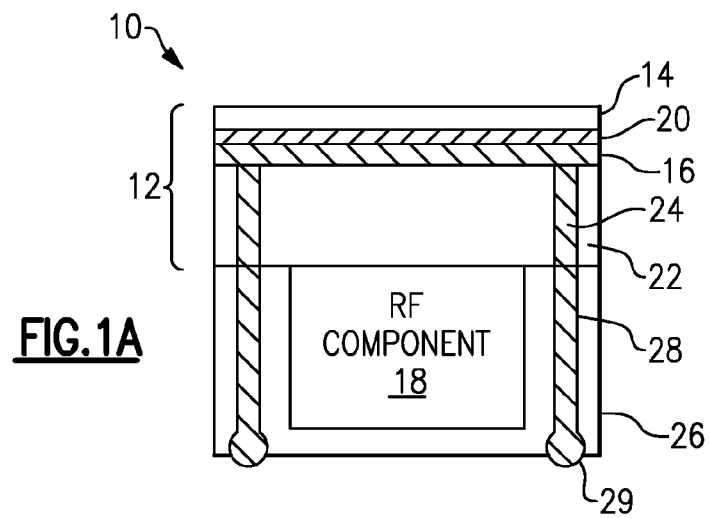
FIG. 1A shows a cross section of an antenna in a package system according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a figure and/or a subset of the elements illustrated in a figure. Further, some embodiments can incorporate any suitable combination of features from two or more figures.

There is a desire for a relatively low cost packaging technology to shield circuits to reduce radiated harmonics and also allow for an antenna unshielded from receiving and/or transmitting signals. Aspects of this disclosure relate to a shielded package with an integrated antenna. A laminated substrate can be fabricated in which an antenna is printed on the top layer and a ground plane for shielding is included in a layer underneath the top layer. Other layers of the laminate substrate can implement signal routing. An electronic component, such as a radio frequency (RF) component, can be disposed along a bottom layer of the laminate substrate. Bumps can be disposed around the electronic component and electrically connected to the ground plane. The bumps can be solder bumps in certain applications. The bumps can include copper pillars in various applications. The bumps can attach the module to a carrier or directly to a system board. The electronic component can be surrounded by bumps. For example, outside edges of the electronic component can have ground bumps that are connected to the ground plane by way of vias. The ground bumps around the electronic component can be connected to ground of a carrier or system board. Accordingly, a shielding structure with can be completed when the module is placed onto a carrier or system board. The shielding structure can function as a Faraday cage around the electronic component. The shielding structure around the electronic component can shield the electronic component from signals external to the shielding structure and/or shield circuits outside of the shielding structure from the electronic component.

One aspect of this disclosure is a module that includes a multi-layer substrate, an antenna, a radio frequency (RF) component, and conductive features disposed around the RF component. The multi-layer substrate has a first side and a second side opposite to the first side. The multi-layer substrate includes a ground plane. The antenna is on the first side of the multi-layer substrate. The RF component is on the second side of the multi-layer substrate such that the ground plane is positioned between the antenna and the RF component. The conductive features are disposed around the RF component and electrically connected to the ground plane. The conductive features and the ground plane configured to provide shielding for the RF component.

Another aspect of this disclosure is an RF circuit assembly that includes a laminate substrate having a first side and a second side opposite the first side, a printed antenna on the first side of the laminate substrate, an RF component attached on the second side of the laminate substrate, and a plurality of bumps disposed around the RF component. The laminate substrate includes a ground plane that is positioned between the printed antenna and the RF component. The bumps form at least a portion of an electrical connection to the ground plane to thereby form at least a portion of a shielding structure around the RF component. The bumps can include solder bumps and/or copper pillars.

Another aspect of this disclosure is system board assembly that includes a laminate substrate having a first side and a second side opposite to the first side, a printed antenna on the first side of the laminate substrate, an RF component attached on the second side of the laminate substrate, a plurality of bumps disposed around the RF component, and a system board. The laminate substrate includes at least one layer forming a ground plane. The ground plane is positioned between the printed antenna and the RF component. The plurality of bumps is electrically connected to the ground plane. The system board includes ground pads electrically connected to ground plane by way of the plurality of bumps such that a shielding structure is formed around the RF component.

FIG. 1A shows a cross section of an antenna in a package system 10 according to an embodiment. The antenna in a package system 10 is an example of a radio frequency module. The antenna in a package system 10 includes an antenna integrated with and shielded from an RF component. The antenna is unshielded from transmitting RF signals to and receiving RF signals from remote to the system. Accordingly, the antenna can transmit and/or receive any suitable RF signal. The antenna can transmit and/or receive RF signals for a system on a chip (SOC). In certain embodiments, the antenna of the antenna in a package system 10 can be arranged to transmit and/or receive Bluetooth and/or ZigBee signals.

The illustrated antenna in a package system 10 includes a multi-layer substrate 12 that includes an antenna layer 14, a ground plane 16, an insulating layer 20, and an other layer 22. An RF component 18 is attached to the multi-layer substrate 12 on a side opposite the antenna layer 14. The ground plane 16 is disposed between the antenna layer 14 and the RF component 18 such that the ground plane 16 provides shielding between the RF component 18 and the antenna layer 14. The antenna 14 can be in communication with the RF component 18 by way of one or more wire bonds, by way of one or more vias extending through the substrate 12 outside of the shielding structure, by way of magnetic coupling, or any suitable combination thereof.

The multi-layer substrate 12 can be a laminate substrate. The insulating layer 20 can be disposed between the antenna layer 14 and the ground plane 16. The insulating layer 20 can include any suitable dielectric material. The multi-layer substrate 12 can include one or more other layers 22, which can implement signal routing and/or passive components. Vias 24 extending from the ground plane 16 to the bottom side of the multi-layer substrate 12 shown in FIG. 1A can provide ground connections at the bottom side of the multi-layer substrate 12. In some implementations, each of the vias 24 can be implemented by several vias through different insulating layers connected to each other by metal in component layers disposed between insulating layers.

The RF component 18 can include any suitable circuitry configured to receive and/or provide an RF signal. For instance, the RF component 18 can include a power amplifier, a low-noise amplifier, an RF switch, a filter, a matching network, or any combination thereof. An RF signal can have a frequency in the range from about 30 kHz to 300 GHz. In accordance with certain communications standards, RF signal can be in a range from about 450 MHz to about 6 GHz, in a range from about 700 MHz to about 2.5 GHz, or in a range from about 2.4 GHz to about 2.5 GHz. In certain implementations, the RF component 18 can receive and/or provide signals in accordance with a wireless personal area network (WPAN) standard, such as Bluetooth, ZigBee, Z-Wave, Wireless USB, INSTEON, IrDA, or Body Area Network. In some other implementations, the RF component and receive and/or provide signals in accordance with a wireless local area network (WLAN) standard, such as Wi-Fi.

The RF component 18 can be encapsulated in molding material 26. Through mold vias 28 can extend through the molding material 26 to bumps 29. The bumps 29 can be any suitable conductive bumps, such as solder bumps, solder balls, copper pillars, or the like. The bumps 29 can facilitate mounting of the antenna in a package system 10 onto a system board. Bumps 29 can be in physical contact with through mold vias 28. Accordingly, the bumps 29 can be electrically connected to the ground plane 16 by way of through mold vias 28 and vias 24 in the multi-layer substrate 12. While two bumps 29, two through mold vias 28, and two vias 24 are illustrated in the cross section of FIG. 1A, any suitable number of such elements can be included in the antenna in a package system 10 to provide a suitable ground connection and/or to provide suitable shielding around the RF component 18. For instance, the bumps 29 can extend along outer edges of the antenna in a package system 10 to surround the RF component 18 in plan view. Corresponding through mold vias 28 and vias 24 can be implemented with such bumps 29.

Figure 1B:
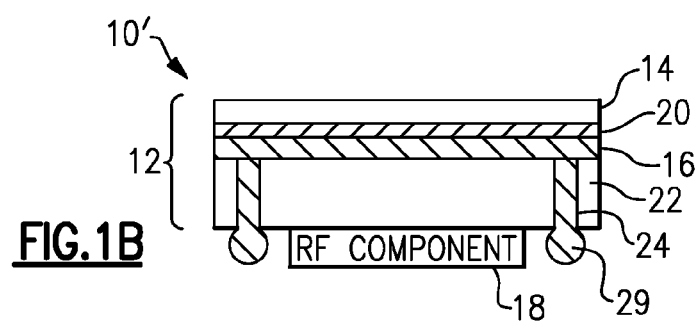
FIG. 1B shows a cross section of an antenna in a package system according to an embodiment.

FIG. 1B shows a cross section of an antenna in a package system 10' according to an embodiment. The antenna in a package system 10' is another example of a radio frequency module. The antenna in a package system 10' of FIG. 1B is similar the antenna in a package system 10 of FIG. 1A except that the RF component 18 is unencapsulated in the antenna in a package system 10' and the bumps 29 are in physical contact with vias 24 in the multi-layer substrate 12. In some applications, the antenna in a package system 10' can be mounted onto a carrier.

Figure 2:
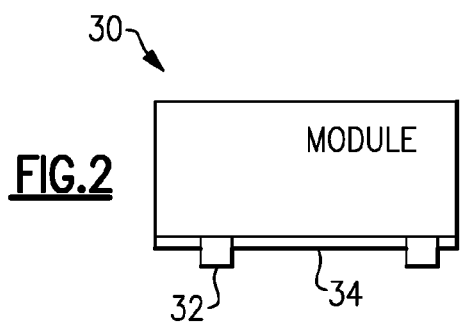
FIG. 2 shows a cross section of an antenna in a package system with solder bumps providing standoff according to an embodiment.

FIG. 2 shows a cross section of an antenna in a package system 30 with bumps providing standoff according to an embodiment. FIG. 2 shows that after reflow bumps 32 can extend farther from a module than a solder resist 34. This can enable the bumps 32 to provide standoff between an RF component and a system board or other substrate on which an antenna in a package system 30 is disposed. Any suitable features shown in FIG. 2 can be implemented in connection with any of the antenna in a package systems discussed herein.

Figure 3A:
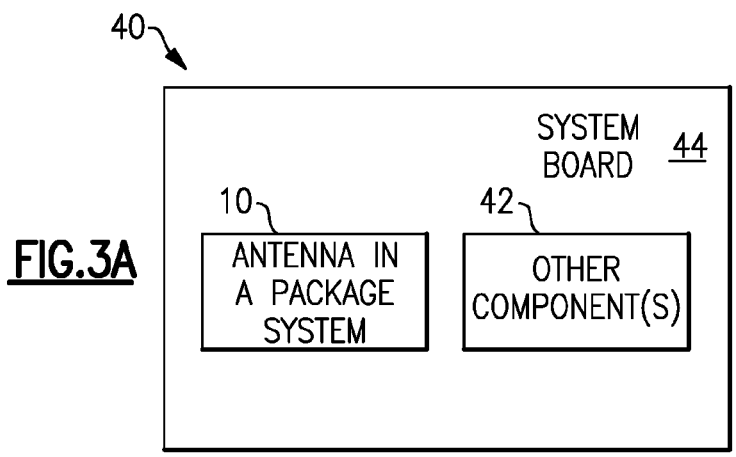
FIG. 3A illustrates a system board assembly with an antenna in a package module and another component disposed on a system board according to an embodiment.
Figure 3B:
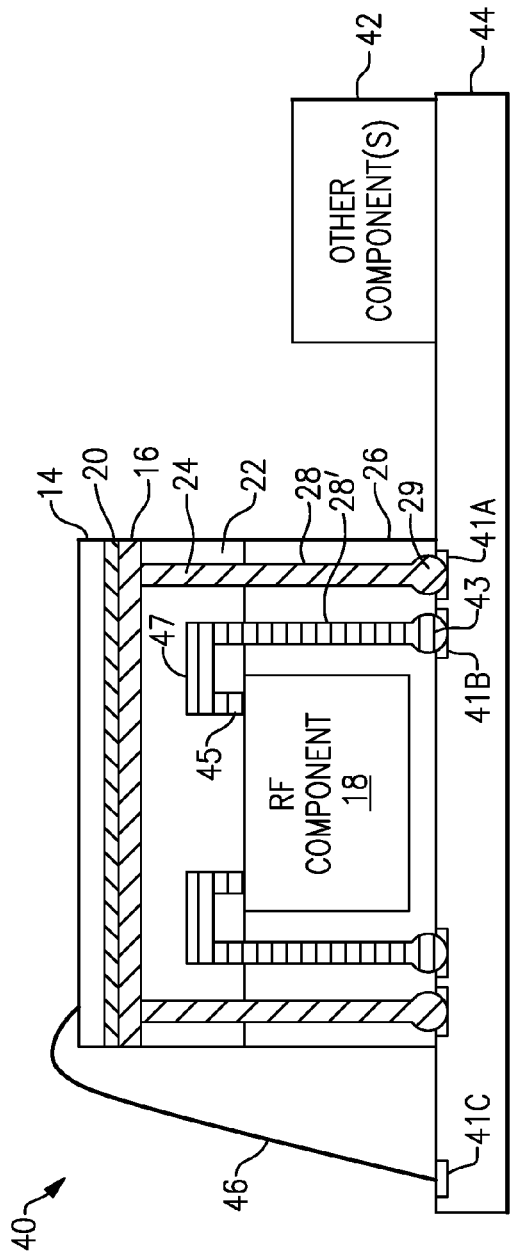
FIG. 3B illustrates cross section of a system board assembly with an antenna in a package module and another component disposed on a system board according to an embodiment.
Figure 3C:
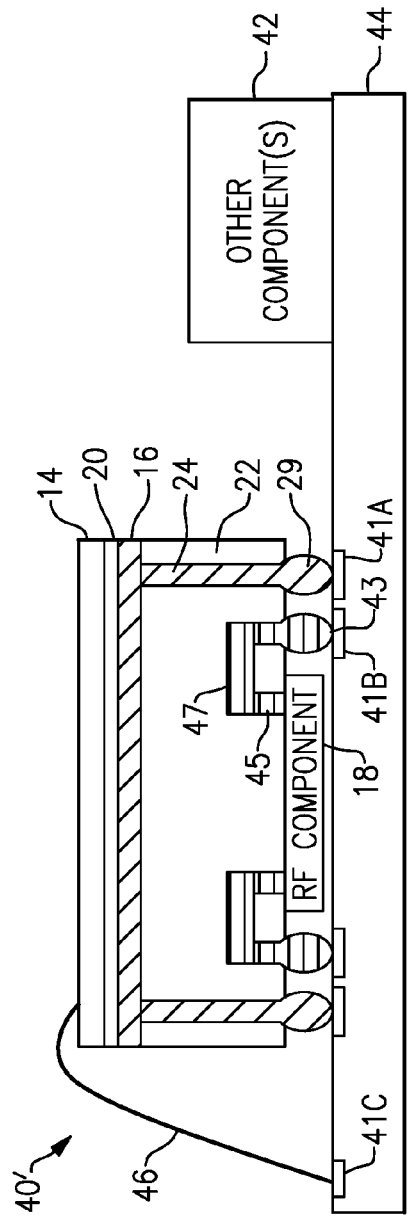
FIG. 3C illustrates cross section of a system board assembly with an antenna in a package module and another component disposed on a system board according to an embodiment.

FIGS. 3A to 3C illustrate example system board assemblies. Any suitable principles and advantages associated with these system board assemblies can be implemented with any of the antenna in a package systems and/or any of the RF modules discussed herein. FIG. 3A illustrates a system board assembly 40 with an antenna in a package system 10 and other component(s) 42 disposed on a system board 44 according to an embodiment. The system board 44 can be any suitable application board, such as a phone board for a mobile phone. Bumps 29 of the antenna in a package system 10 can be in physical contact with one or more ground connections of the system board 44. Accordingly, a shielding structure can surround the RF component 18 of the antenna in a package system 10 in three dimensions. The shielding structure can provide shielding between the RF component 18 and the antenna layer 14 of the antenna in a package system 10. The shielding structure can provide shielding between the RF component 18 and one or more other components 42 disposed on the system board 44. Accordingly, the RF component 18 can be shielded from radiation emitted by the one or more other components 42. At the same time, the other component(s) 42 can be shielded from radiation emitted from the RF component 18. The other component(s) 42 can include any other circuitry on the system board 44, such as other RF circuitry, a baseband processor, memory, the like, or any suitable combination thereof.

FIG. 3B illustrates cross section of a system board assembly 40 with an antenna in a package module and another component 42 disposed on a system board 44 according to an embodiment. As illustrated, the system board 44 includes ground pads 41A in contact with bumps 29. In FIG. 3B, inner bumps 43 are surrounded by a shielding structure that includes bumps 29. The inner bumps 43 can provide electrical connections between circuitry of the RF component 18 and the system board 44. Pads 41B on the system board 44 can be electrically connected to the RF component 18 by way of respective bumps 43, vias 28', routing metal 47, and vias 45. The antenna in the antenna layer 14 can be electrically connected to a pad 41C of the system board 44. As illustrated, a wire bond 46 electrically connects the antenna to the pad 41C. The system board 44 can provide signal routing between the antenna and the RF component 18 and/or the other components 42.

FIG. 3C illustrates cross section of a system board assembly 40' with an antenna in a package module and another component 42 disposed on a system board 44 according to an embodiment. The system board assembly 40' is like the system board assembly 40 of FIG. 3B except that a different antenna in a package system is implemented. In the system board assembly 40', pads 41B on the system board 44 can be electrically connected to the RF component 18 by way of respective bumps 43, vias 45, and routing metal 47.

Figure 4:
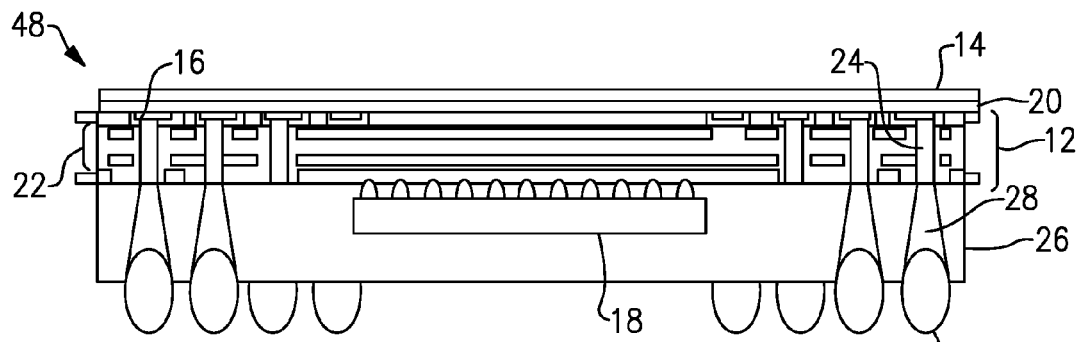
FIG. 4 is a cross sectional view of an antenna in a package system according to an embodiment.

FIG. 4 is a cross sectional view of an antenna in a package system 48 according to an embodiment. The illustrated antenna in a package system 48 includes several components of the antenna in a package systems of FIGS. 1A and 1B. In FIG. 4, more details regarding the layers 22 are illustrated. In the illustrated antenna in a package system 48, the layers 22 can implement signal routing. As shown in FIG. 4, the RF component 18 and the molding material 26 can be thicker in the illustrated vertical dimension than the multi-layer substrate 12.

Figure 5A:
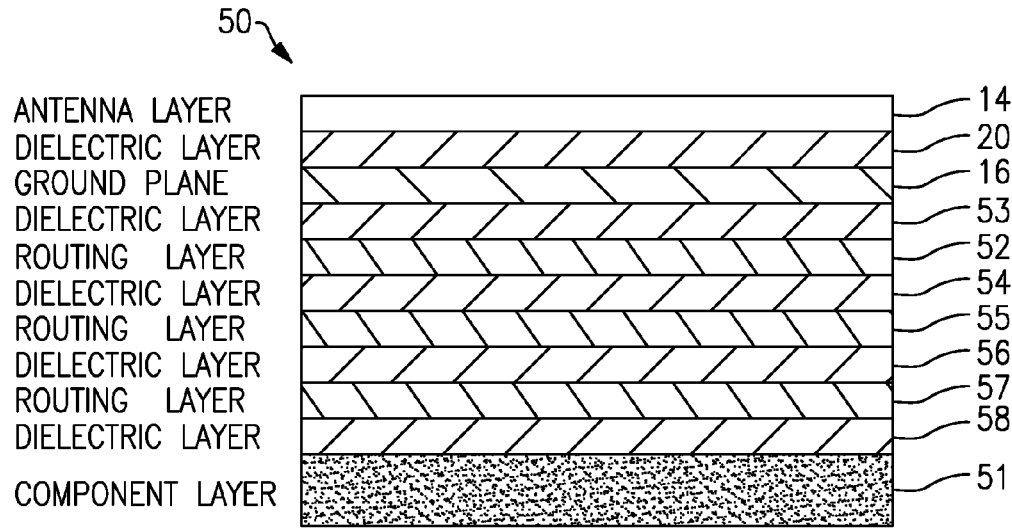
FIG. 5A is an example cross sectional view of layers radio frequency circuit assembly with an integrated antenna according to an embodiment.
Figure 5B:
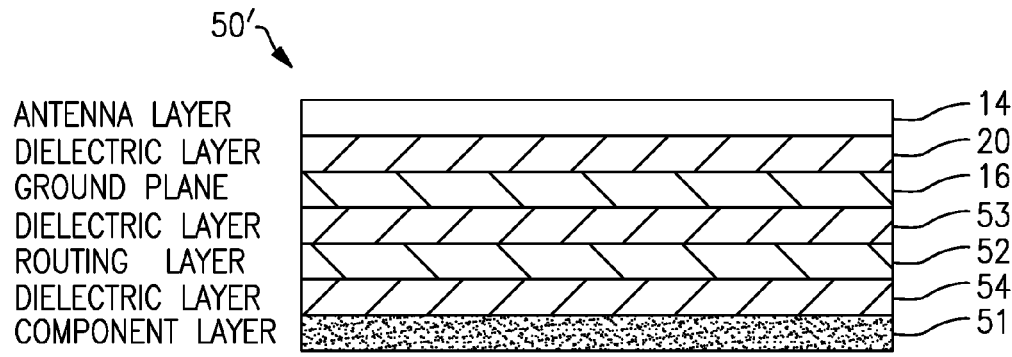
FIG. 5B is example cross sectional view of layers radio frequency circuit assembly with an integrated antenna according to another embodiment.

FIGS. 5A and 5B are example cross sectional views of layers radio frequency circuit assemblies 50 and 50', respectively, with integrated antennas according to certain embodiments. These figures generally illustrate the layers of the radio frequency circuit assemblies. Details of some examples of the illustrated layers of FIGS. 5A and 5B are provided in connection with FIGS. 6A to 7D.

In FIG. 5A, the illustrated radio frequency circuit assembly 50 includes an antenna layer 14, a ground plane 16, an insulating layer 20 disposed between the antenna layer 14 and the ground plane 16, a component layer 51, routing layers 52, 55, 57, and insulating layers 53, 54, 56, and 58. The routing layers 52, 55, 57, the insulating layers 20, 53, 54, 56, and 58, and the ground plane 16 can be included in a laminated substrate. The antenna layer 14 can also be considered part of the laminated substrate. The component layer 51 can be integrated with the laminated substrate. The component layer 51 can include any of the RF components discussed herein, such as the RF component 18. The component layer 51 can include a semiconductor die that includes RF circuits.

Each of the routing layers can have insulating layers on opposing sides to insulate the routing layers from others routing layers and/or other layers, such as the ground plane 16 or the component layer 51. As illustrated, an insulating layer 53 is disposed between the ground plane 16 and the routing layer 52 closest to the ground plane 16. As also shown in FIG. 5A, an insulating layer 58 is disposed between the component layer 51 and the routing layer 57 closest to the component layer 51. The insulating layers can be formed of, for example, any suitable dielectric material.

The routing layers can implement metal routing. Vias (not illustrated in FIG. 5A) extending through an insulating layer can provide connections between metal in layers on opposing sides of the insulating layer.

Any suitable number of routing layers can be included in a radio frequency circuit assembly. For instance, the radio frequency circuit assembly 50' of FIG. 5B includes one routing layer 52. As another example, the radio frequency circuit assembly 50 of FIG. 5A includes three routing layers 52, 55, 57. Relatively more routing layers can be implemented to handle an increasing amount of signal routing between circuitry of the component layer 51. Alternatively or additionally, relatively more routing layers can be implemented to handle an increasing amount of signal routing between circuitry of the component layer 51 and circuitry external to a radio frequency circuit assembly 50 and/or 50'. Signal routing can be shielded by a shielding structure that includes the ground plane 16 and vias through the insulating layers of the radio frequency circuit assembly 50 and/or 50' connected with ground solder bumps and disposed around an RF component of the component layer 51. Such vias can be electrically connected to conductive features, such as bumps, disposed around the RF component in the component layer 51. Passive components, such as one or more spiral inductors, can be implemented in one or more of the routing layers. One or more passive components in routing layer(s) can be included in a matching network associated with radio frequency circuitry of the component layer 51.

The antenna layer 14 of any of the antenna in a package systems discussed herein can include any suitable printed antenna. A printed antenna can be formed from one or more conductive traces on a substrate. The one or more conductive traces can be formed by etching a metal pattern on the substrate. A printed antenna can be a microstrip antenna. Printed antennas can be manufactured relatively inexpensively and compactly due to, for example, their 2-dimensional physical geometries. Printed antennas can have a relatively high mechanical durability.

Figure 6A:
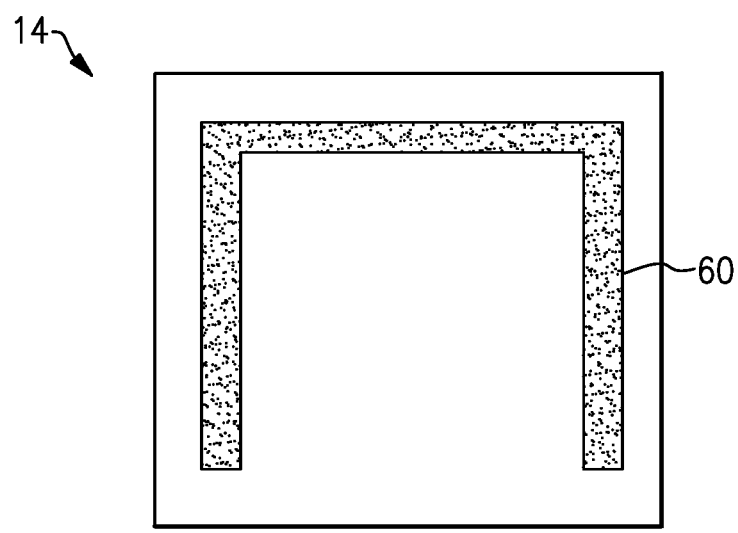
FIG. 6A illustrates an example printed antenna of a radio frequency circuit assembly according to an embodiment.
Figure 6B:
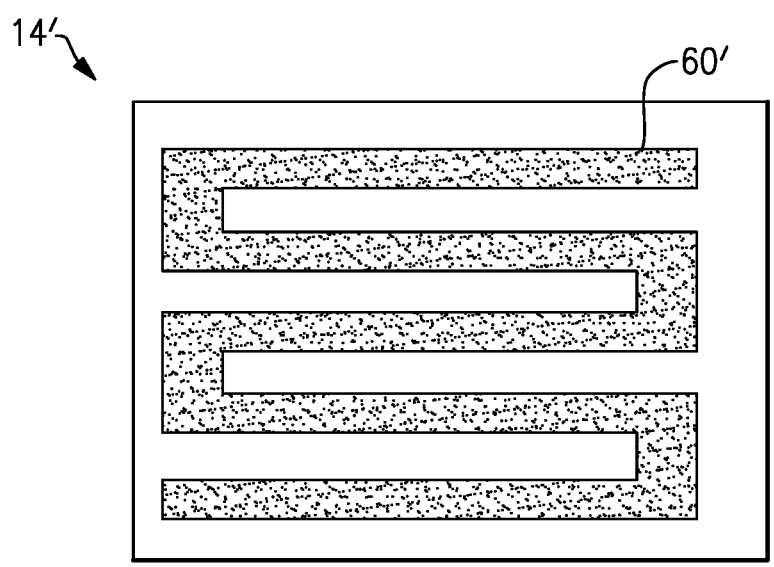
FIG. 6B illustrates an example printed antenna of a radio frequency circuit assembly according to another embodiment.

FIGS. 6A and 6B illustrate example printed antennas of radio frequency circuit assemblies according to certain embodiments. These figures illustrate examples of a top view of a radio frequency circuit assembly, such as the radio frequency circuit assembly 50 and/or 50'. The antenna 60 can be any suitable shape. For instance, the antenna 60 can be U-shaped as shown in FIG. 6A. The antenna 60 in FIG. 6A can be a folded quarter wave antenna. As another example, the antenna 60' can be a meandering shape as shown in FIG. 6B. The antenna can be coil shaped in certain implementations. The antenna can be a loop antenna in some implementations. The antenna of the antenna layer 14 and/or 14' can serve as an antenna for a system on a chip. The antenna can transmit and/or receive any suitable wireless communication signal. Such antennas can be configured to transmit and/or receive Bluetooth and/or ZigBee signals, for example. The antenna of the antenna layer can be in communication with transmit and/or receive circuitry by way of one or more wire bonds, by way of one or more vias extending through a substrate on which the antenna is disposed (e.g., outside of the shielding structure), by way of magnetic coupling, or any suitable combination thereof. The antenna of the antenna layer can be in communication with an RF component shielded from an antenna by a shielding structure by way of one or more wire bonds, by way of one or more vias extending through a substrate on which the antenna is disposed (e.g., outside of the shielding structure), by way of magnetic coupling, or any suitable combination thereof.

FIGS. 7A to 7D illustrate example component layers of radio frequency circuit assemblies according to certain embodiments. These figures include schematic views of a bottom view of a radio frequency circuit assembly, such as the radio frequency circuit assembly 50 and/or 50'.

As illustrated in FIGS. 7A to 7D, ground bumps 29 can surround an RF component and form a portion of a shielding structure around the RF component. The ground bumps 29 can be disposed along each edge of the component layer 51. The ground bumps 29 can be soldered or otherwise connected to a ground connection of a carrier assembly such that the ground plane 16, the bumps 29, and ground of the carrier assembly together provide three-dimensional shielding of the RF component. The carrier assembly can be implemented by ethylvinylbenzene (EVB) or another laminate, for example.

As illustrated, the ground bumps 29 surround signal routing bumps 71. The signal routing bumps 71 can provide at least a portion of a connection between circuitry of the component layer 51 with metal routing in a routing layer that is disposed between the component layer 51 and the ground plane 16. Alternatively or additionally, the signal routing bumps 71 can provide at least a portion of an electrical connection between circuitry of the RF component 18 and a system board on which an antenna in a package system is disposed.

The example component layers of FIGS. 7A to 7D illustrate various electronic components that can be shielded from the antenna of the antenna layer 14 by the ground plane 16. Each of these figures illustrates circuitry that can be included within a shielding structure. Other circuitry and/or components can alternatively or additionally be included within such a shielding structure. For instance, one or more of a crystal, a front end integrated circuit, or a system on a chip can be included within the shielding structure. As one example, a crystal, a front end integrated circuit, and a system on a chip can be implemented within the shielding structure and shielded from an integrated antenna by the shielding structure.

FIG. 7A illustrates a component layer 51 that includes an RF component 18 connected to signal routing bumps 71. Some example RF components are illustrated in FIGS. 7B to 7D. FIG. 7B illustrates a component layer 51' that includes a low noise amplifier (LNA) 72 and a matching network 73. FIG. 7C illustrates a component layer 51'' that includes a power amplifier 74 and a matching network 75. FIG. 7D illustrates a component layer 51''' that includes an LNA 72, a power amplifier 74, and matching networks 73 and 75. The circuits illustrated in FIGS. 7A to 7D are connected to signal routing bumps 71 and are surrounded by the ground bumps 29 in a respective component layer. In some other implementations, the matching network 73 and/or the matching network 75 can include one or more passive component (e.g., one or more resistors, one or more capacitors, and/or one or more inductors implemented in a routing layer disposed between a component layer and a ground plane.

Figure 8A:
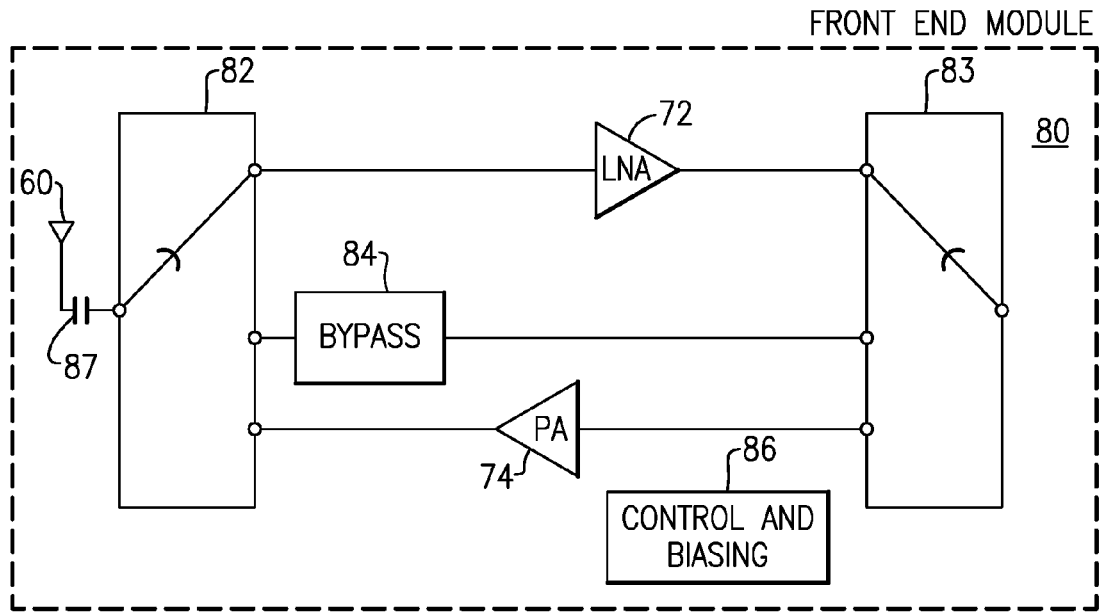
FIG. 8A is a schematic block diagram of a front end module according to an embodiment.
Figure 8B:
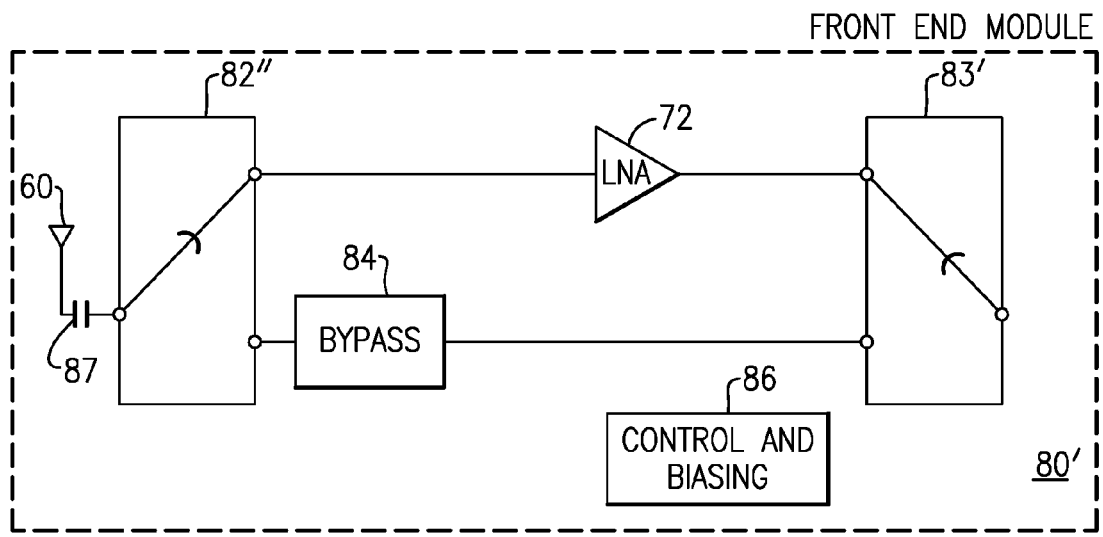
FIG. 8B is a schematic block diagram of a front end module according to another embodiment.
Figure 8C:
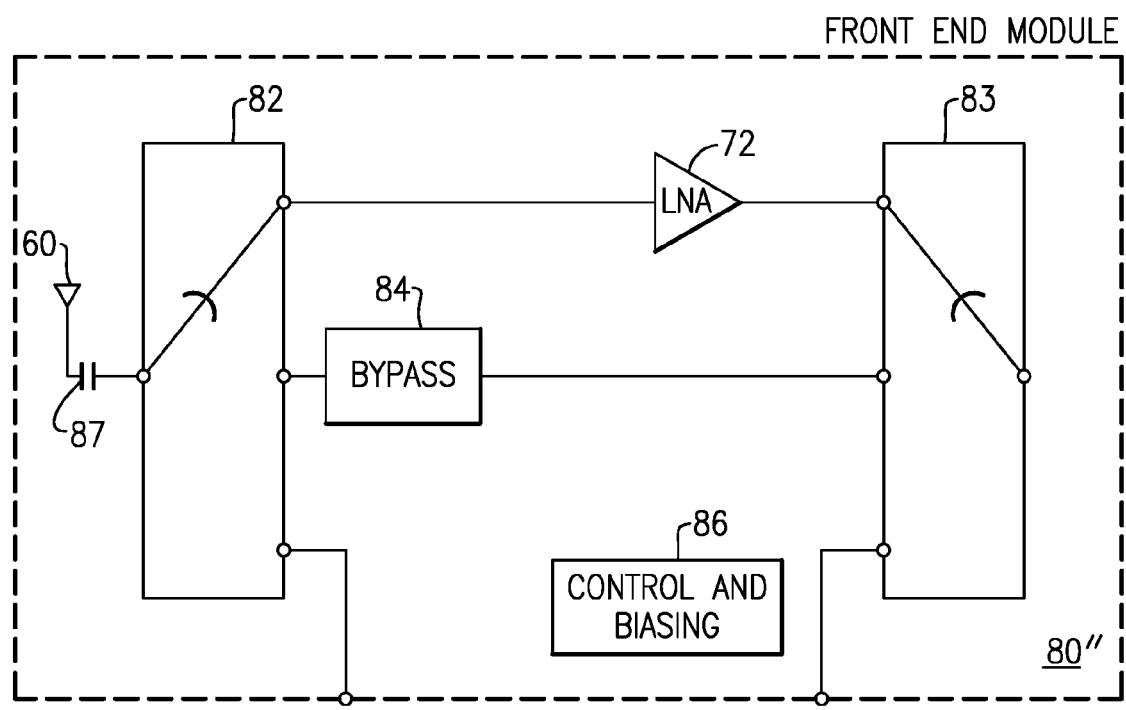
FIG. 8C is a schematic block diagram of a front end module according to another embodiment.

FIGS. 8A, 8B, and 8C are schematic block diagrams of front end modules with integrated antennas according to certain embodiments. An RF front end can include circuits in a signal path between an antenna and a baseband system. Some RF front ends can include circuits in signal paths between one or more antennas and a mixer configured to module a signal to RF or to demodulate an RF signal.

The front end modules of FIGS. 8A, 8B, and 8C can be packaged modules. Such packaged modules can include relatively low cost laminate based front end modules that combine low noise amplifiers with power noise amplifiers and/or RF switches in certain implementations. Some such packaged modules can be multi-chip modules. In the modules of FIGS. 8A, 8B, and 8C, an antenna is integrated with the RF front end. The integrated antenna of such RF front end modules can be implemented in accordance with any of the principles and advantages discussed herein. These RF front end modules can be antenna in a package systems. The integrated antenna can be implemented in an antenna layer on a first side of a substrate that is shielded from the circuits of the RF front end on a second side of the substrate at least partly by a ground plane implemented in a layer of the substrate.

FIG. 8A is a schematic block diagram of an RF front end module 80 according to an embodiment. The RF front end module 80 is configured to receive RF signals from an integrated antenna 60 and to transmit RF signals by way of the integrated antenna 60. The integrated antenna 60 can be implemented in accordance with any of the principles and advantages discussed herein. The illustrated front end module 80 includes a first multi-throw switch 82, a second multi-throw switch 83, a receive signal path that includes an LNA 72, a bypass signal path that includes a bypass network 84, and a transmit signal path that includes a power amplifier 74. The low noise amplifier 72 can be any suitable low noise amplifier. The bypass network 84 can include any suitable network for matching and/or bypassing the receive signal path and the transmit signal path. The bypass network 84 can be implemented by a passive impedance network and/or by a conductive trace or wire. The power amplifier 74 can be implemented by any suitable power amplifier. The LNA 72, the switches 82 and 83, and the power amplifier 74 can be shielded from the antenna 60 by a shielding structure in accordance with any of the principles and advantages discussed herein.

The first multi-throw switch 82 can selectively electrically connect a particular signal path to the antenna 60. The first multi-throw switch 82 can electrically connect the receive signal path to the antenna 60 in a first state, electrically connect the bypass signal path to the antenna 60 in a second state, and electrically connect the transmit signal to the antenna 60 in a third state. The antenna 60 can be electrically connected to the switch 82 by way of a capacitor 87. The second multi-throw switch 83 can selectively electrically connect a particular signal path to an input/output port of the front end module 80, in which the particular signal path is the same signal path electrically connected to the antenna 60 by way of the first multi-throw switch 82. Accordingly, second multi-throw switch 83 together with the first multi-throw switch 82 can provide a signal path between the antenna 60 and an input/output port of the front end module 80. A system on a chip (SOC) can be electrically connected to the input/output port of the front end module 80.

The control and biasing block 86 can provide any suitable biasing and control signals to the other circuits of the front end module 80. For example, the control and biasing block 86 can provide bias signals to the LNA 72 and/or the power amplifier 74. Alternatively or additionally, the control and biasing block 86 can provide control signals to the multi-throw switches 82 and 83 to set the state of these switches.

FIG. 8B is a schematic block diagram of an RF front end module 80' according to an embodiment. The RF front end module 80' of FIG. 8B is similar to the RF front end module 80 of FIG. 8A, except that a transmit signal path is omitted and the multi-throw switches 82' and 83' each have one fewer throw than corresponding multi-throw switches in the front end module 80 of FIG. 8A. The illustrated front end module 80' includes a receive signal path and a bypass signal path and does not include a transmit signal path.

FIG. 8C is a schematic block diagram of an RF front end module 80" according to an embodiment. The RF front end module 80" of FIG. 8C is like the RF front end module 80 of FIG. 8A, except that a power amplifier of the transmit signal path is omitted from the RF front end module 80". The RF front end module 80" includes input/output ports for coupling to throws of the multi-throw switches 82 and 83. A power amplifier external to the front end module 80" can be electrically connected between these input/output ports such that the power amplifier is included in the transmit signal path between the multi-throw switches 82 and 83. The power amplifier can be included in a different packaged module than the illustrated elements of the RF front end module 80".

Figure 9A:
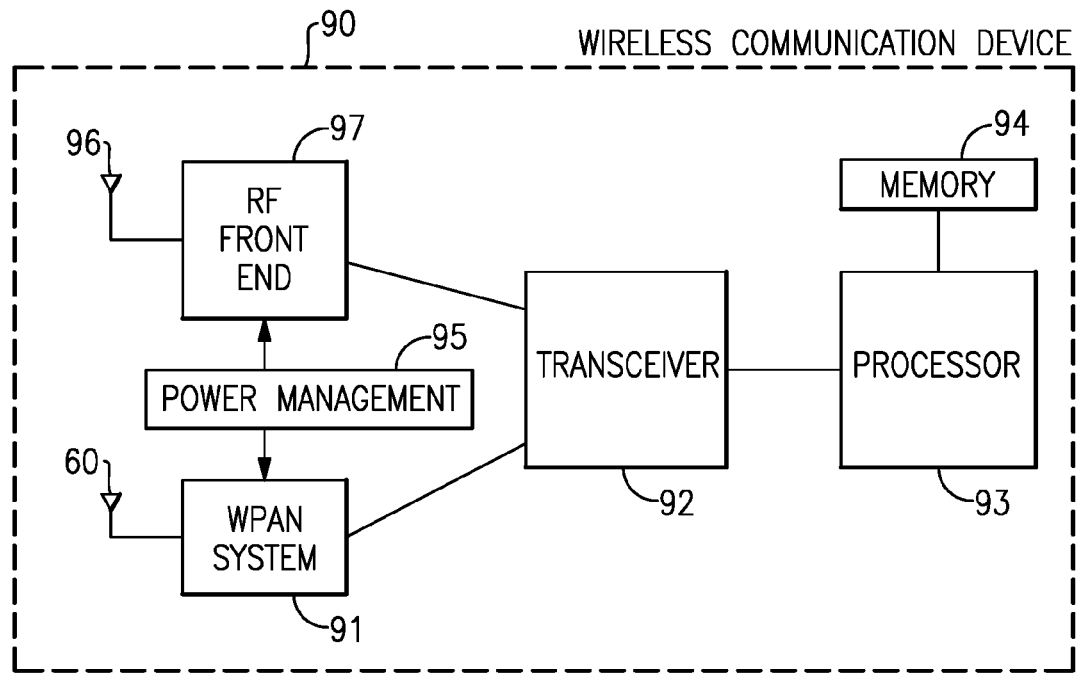
FIG. 9A is schematic block diagram of an illustrative wireless communication device that includes a shielded package with an integrated antenna in accordance with one or more embodiments.
Figure 9B:
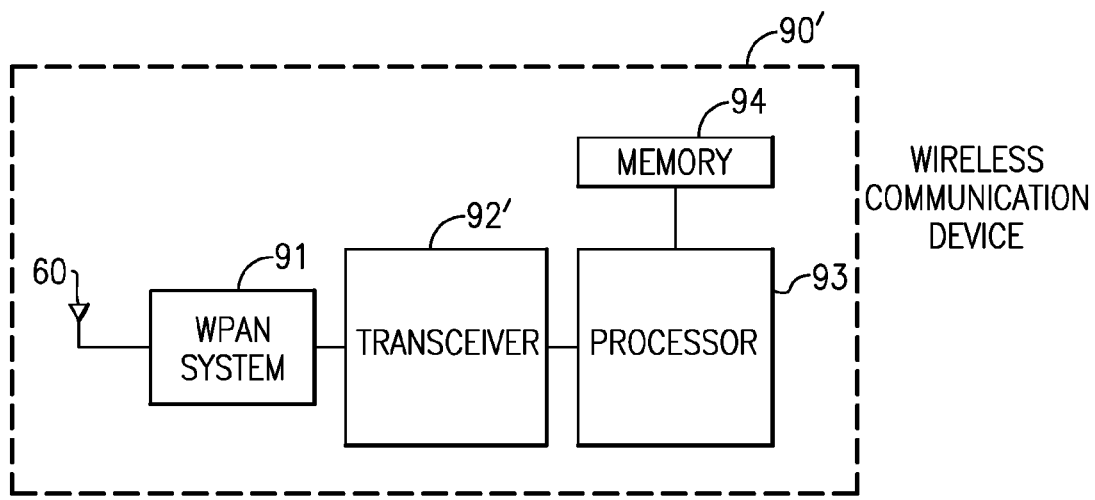
FIG. 9B is schematic block diagram of another illustrative wireless communication device that includes a shielded package with an integrated antenna in accordance with one or more embodiments.

FIGS. 9A and 9B are schematic block diagrams of illustrative wireless communication devices that include a shielded package with an integrated antenna in accordance with one or more embodiments. The wireless communication device 90 can be any suitable wireless communication device. For instance, wireless communication device 90 device can be a mobile phone such as a smart phone. As illustrated, the wireless communication device 90 includes a first antenna 60 integrated with a wireless personal area network (WPAN) system 91, a transceiver 92, a processor 93, a memory 94, a power management block 95, a second antenna 96, and an RF front end system 97. Any of the integrated antennas and shielding structures discussed herein can be implemented in connection with the WPAN system 91. The WPAN system 91 is an RF front end system configured for processing RF signals associated with personal area networks (PANs). The WPAN system 91 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system. Such a WLAN system can process Wi-Fi signals or other WLAN signals. Any of the integrated antennas and shielding structures discussed herein can be integrated with the RF front end system 97.

The illustrated wireless communication device 90' of FIG. 9B is a device configured to communicate over a WPAN. The wireless communication device 90' can be relatively less complex than the wireless communication device of FIG. 9A. As illustrated, the wireless communication device 90' includes an antenna 60 integrated with a WPAN system 91, a transceiver 92', a processor 93, and a memory 94. An integrated antenna and a shielding structure can be implemented in connection with the WPAN system 91 in accordance with any of the principles and advantages discussed herein. The wireless communication device 90' can include a WLAN system in place of the illustrated WPAN system in another embodiment. Such a WLAN system can process Wi-Fi signals or other WLAN signals.

Some of the embodiments described above have provided examples in connection with RF components, front end modules and/or wireless communications devices. However, the principles and advantages of the embodiments can be used for any other systems or apparatus that could benefit from any of the circuits described herein. Although described in the context of RF circuits, one or more features described herein can also be utilized in packaging applications involving non-RF components. Similarly, one or more features described herein can also be utilized in packaging applications without the electromagnetic isolation functionality. Any of the principles and advantages of the embodiments discussed can be used in any other systems or apparatus that could benefit from the antennas and/or the shielding structures discussed herein.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A radio frequency module comprising:
a multi-layer substrate having a first side and a second side opposite to the first side, the multi-layer substrate including a ground plane;
an antenna on the first side of the multi-layer substrate;
a radio frequency component disposed on the second side of the multi-layer substrate such that the ground plane is positioned between the antenna and the radio frequency component;
bumps disposed around the radio frequency component and electrically connected to the ground plane, the bumps and the ground plane configured to provide shielding for the radio frequency component;
molding material around the radio frequency component; and
a via extending through the molding material, the via being included in an electrical connection between the ground plane and a bump of the bumps.

2. The radio frequency module of claim 1 further comprising another bump configured to provide an electrical connection to the radio frequency component.

3. The radio frequency module of claim 1 wherein the bumps extend farther away from the multi-layer substrate than the radio frequency component extends away from the multi-layer substrate.

4. The radio frequency module of claim 1 wherein the multi-layer substrate includes routing layers and insulating layers.

5. The radio frequency module of claim 1 wherein the bumps include at least one of a copper pillar, a solder ball, or a solder bump.

6. The radio frequency module of claim 1 wherein the antenna is printed on the first side of the multi-layer substrate.

7. The radio frequency module of claim 1 wherein the multi-layer substrate includes a dielectric layer disposed between the ground plane and the antenna.

8. The radio frequency module of claim 1 wherein the multi-layer substrate includes a passive component.

9. The radio frequency module of claim 8 wherein the passive component is included in a matching network associated with the radio frequency component.

10. The radio frequency module of claim 1 wherein the radio frequency component includes at least one of a low-noise amplifier or a power amplifier.

11. The radio frequency module of claim 1 wherein the antenna is configured to transmit at least one of a Wireless Personal Area Network signal or a Wireless Local Area Network signal.

12. A radio frequency circuit assembly comprising:
a laminate substrate having a first side and a second side opposite to the first side, the laminate substrate including a ground plane;

a printed antenna on the first side of the laminate substrate;

a radio frequency component attached on the second side of the laminate substrate such that the ground plane is positioned between the printed antenna and the radio frequency component;

bumps disposed around the radio frequency component, the bumps being electrically connected to the ground plane such that the bumps and the ground plane form at least a portion of a shielding structure around the radio frequency component;

molding material around the radio frequency component; and a via extending through the molding material, the via being included in an electrical connection between the ground plane and a bump of the bumps.

13. The radio frequency circuit assembly of claim 12 further comprising another bump disposed within the shielding structure and configured to provide an electrical connection to the radio frequency component.

14. The radio frequency circuit assembly of claim 12 wherein the laminate substrate includes routing layers and insulating layers.

15. The radio frequency circuit assembly of claim 12 wherein the bumps include at least one of copper pillars or solder bumps.

16. A system board assembly comprising:

a laminate substrate having a first side and a second side opposite to the first side, the laminate substrate including a ground plane;

a printed antenna on the first side of the laminate substrate;

a radio frequency component attached on the second side of the laminate substrate such that the ground plane is positioned between the printed antenna and the radio frequency component;

bumps disposed around the radio frequency component and being electrically connected to the ground plane;

a system board including ground pads electrically connected to the ground plane by way of the bumps such that a shielding structure is formed around the radio frequency component; and an electronic component on the system board, the shielding structure arranged so as to provide radio frequency isolation between the radio frequency component and the electronic component.

17. The system board assembly of claim 16 further comprising a molding material around the radio frequency component and a via extending through the molding material, the via being included in an electrical connection between the ground plane and a bump of the bumps.

18. The system board assembly of claim 16 wherein the bumps provide standoff between the radio frequency component and the system board.

19. The system board assembly of claim 16 wherein the radio frequency component is embodied on a semiconductor-on-insulator die.

20. The system board assembly of claim 16 wherein the printed antenna and the radio frequency component are embodied in an antenna in a package module.

\* \* \* \* \*